(12) United States Patent
Nagaoka

(10) Patent No.: US 9,111,988 B2
(45) Date of Patent: Aug. 18, 2015

(54) SEMICONDUCTOR DEVICE

(71) Applicant: Tatsuji Nagaoka, Nagakute (JP)

(72) Inventor: Tatsuji Nagaoka, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/166,215

(22) Filed: Jan. 28, 2014

(65) Prior Publication Data

US 2014/0231868 A1   Aug. 21, 2014

(30) Foreign Application Priority Data

Feb. 20, 2013  (JP) ................................ 2013-031396

(51) Int. Cl.
  *H01L 29/66*   (2006.01)
  *H01L 29/739*   (2006.01)
  *H01L 23/482*   (2006.01)

(52) U.S. Cl.
  CPC ........ *H01L 29/7393* (2013.01); *H01L 23/4824* (2013.01); *H01L 29/7397* (2013.01); *H01L 2924/0002* (2013.01)

(58) Field of Classification Search
  CPC . H01L 29/4232; H01L 29/7393; H01L 29/78; H01L 21/044
  USPC ................ 257/144, 163, 287, 341, 500, 502; 438/133, 309, 317, 338
  See application file for complete search history.

(56) References Cited

U.S. PATENT DOCUMENTS

| | | | |
|---|---|---|---|
| 2005/0062168 A1* | 3/2005 | Sano et al. ..................... | 257/778 |
| 2005/0077599 A1* | 4/2005 | Miura et al. ................... | 257/669 |
| 2011/0042741 A1* | 2/2011 | Fukuoka et al. .............. | 257/330 |
| 2011/0298048 A1* | 12/2011 | Senoo et al. .................. | 257/335 |

FOREIGN PATENT DOCUMENTS

| | | |
|---|---|---|
| JP | A-5-175206 | 7/1993 |
| JP | A-2005-19829 | 1/2005 |
| JP | A-2005-116962 | 4/2005 |

* cited by examiner

*Primary Examiner* — Jarrett Stark
*Assistant Examiner* — Shahed Ahmed
(74) *Attorney, Agent, or Firm* — Oliff PLC

(57) ABSTRACT

A semiconductor device includes a semiconductor substrate and a first electrode. An element region, and a non-element region that surrounds this element region, are formed on the semiconductor substrate. The first electrode is arranged on the semiconductor substrate and is electrically connected to the element region formed on the semiconductor substrate. The first electrode is made of at least two materials having different moduli of elasticity. A modulus of elasticity per unit area of an outer peripheral portion of the first electrode when the semiconductor substrate is viewed from above is smaller than a modulus of elasticity per unit area of a center portion of the first electrode.

11 Claims, 5 Drawing Sheets

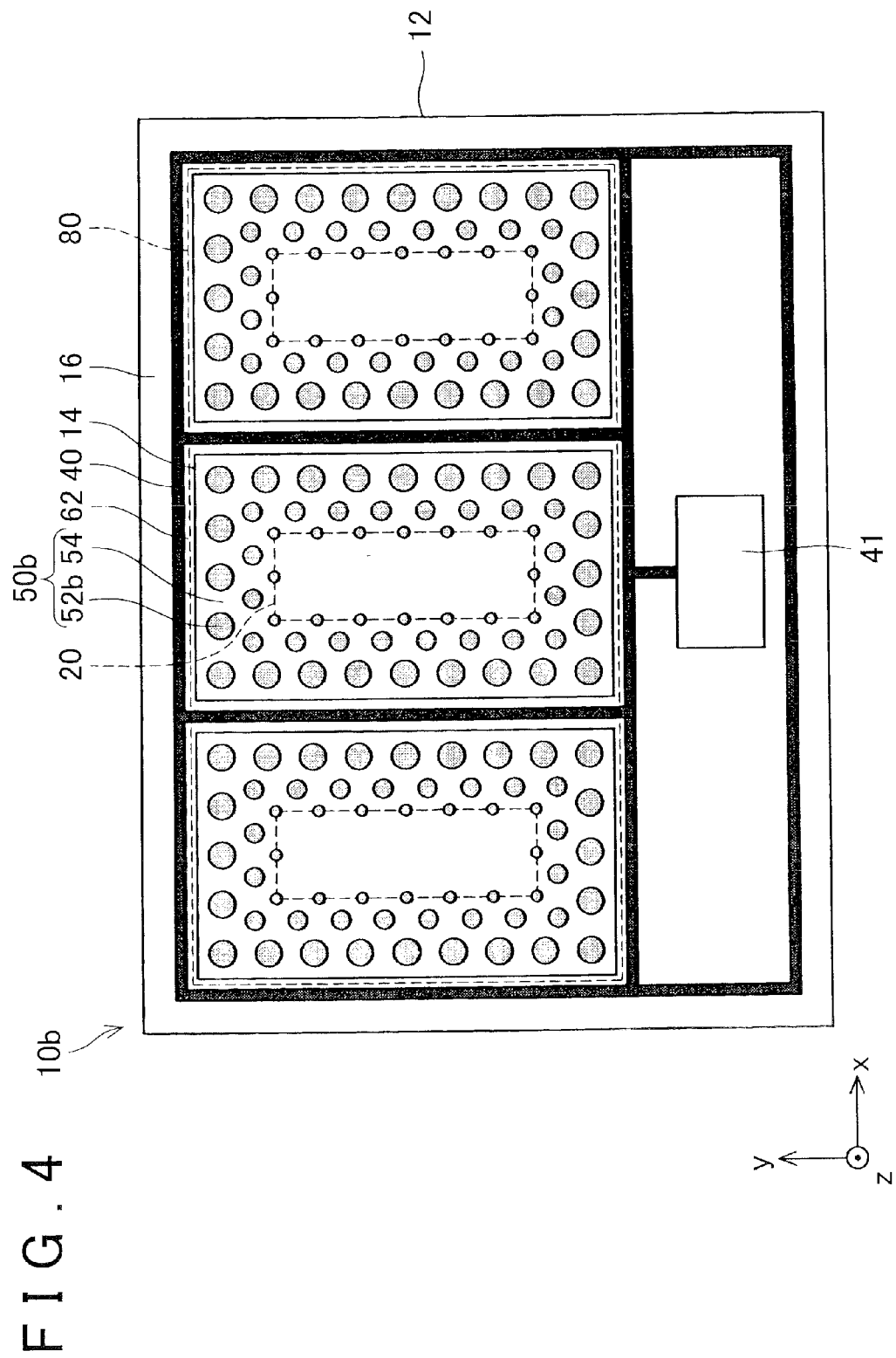

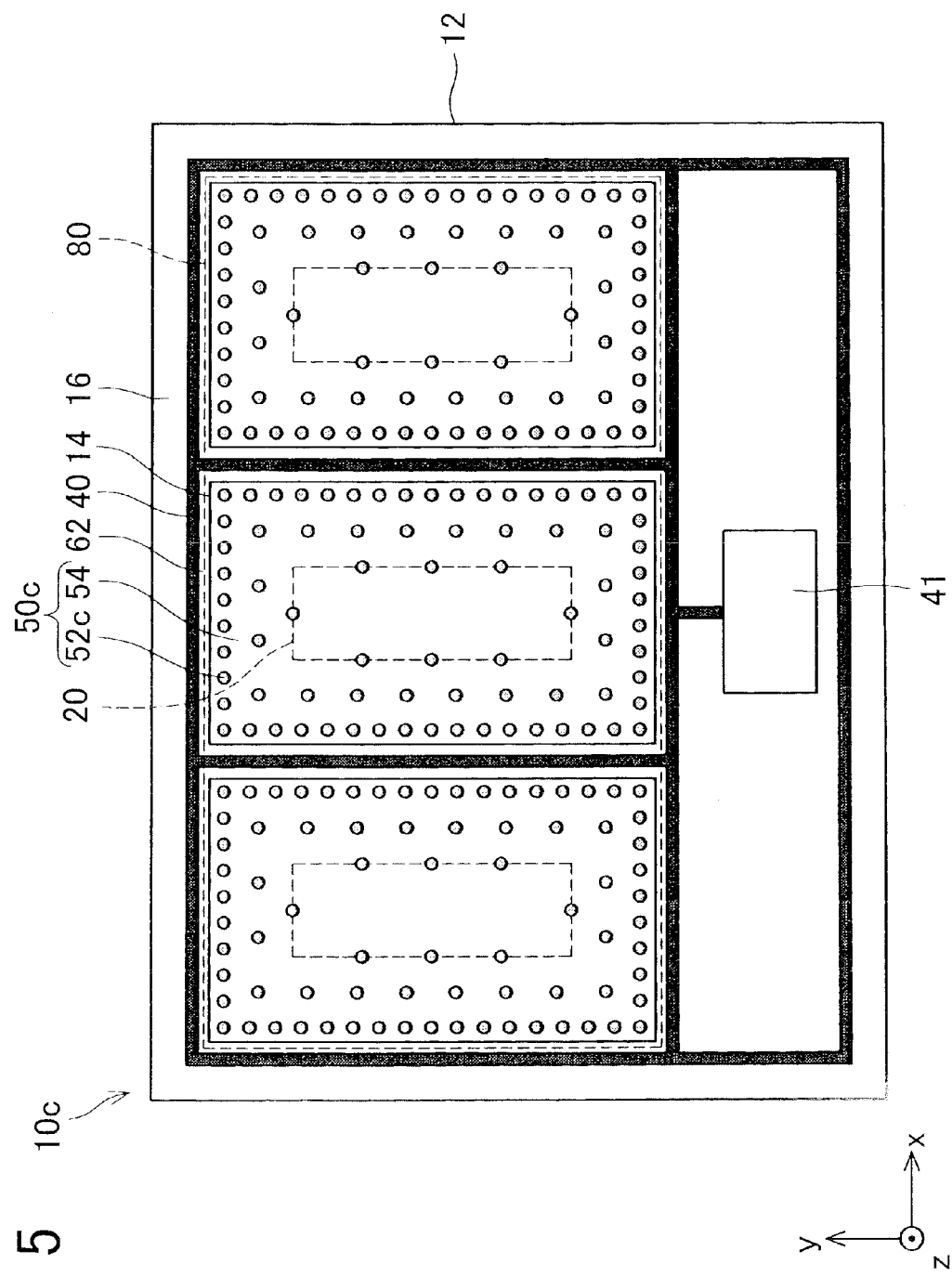

SEMICONDUCTOR DEVICE

INCORPORATION BY REFERENCE

The disclosure of Japanese Patent Application No. 2013-031396 filed on Feb. 20, 2013 including the specification, drawings and abstract is incorporated herein by reference in its entirety.

BACKGROUND OF THE INVENTION

1. Field of the Invention

The invention relates to a semiconductor device.

2. Description of Related Art

Japanese Patent Application Publication No. 2005-116962 (JP 2005-116962 A) describes a package-type semiconductor device in which heat sinks are respectively joined to both sides of a semiconductor chip. An emitter electrode is formed on one surface of the semiconductor chip, and a gate wiring layer is formed around the emitter electrode. A dummy wiring layer that is electrically isolated from the gate wiring layer is formed between the emitter electrode and the gate wiring layer. A metal block is joined to a surface of the emitter electrode via a plated layer and a solder layer. An upper heat sink is joined to a surface of the metal block via the solder layer. A collector electrode is formed on the other surface of the semiconductor chip, and a lower heat sink is joined to a surface of the collector electrode via a solder layer. Typically, with a package-type semiconductor device in which heat sinks are joined to both sides of the semiconductor chip, the heat sinks, metal block, and substrate expand at different thermal expansion rates following a change in temperature, so the plated layer may slide. With the technology described in JP 2005-116962 A, even if the plated layer slides following a change in temperature, the plated layer is able to be stopped by the dummy wiring. Therefore, the emitter electrode is able to be prevented from becoming electrically connected to the gate wiring layer via the plated layer (i.e., a short is prevented).

With the technology described in JP 2005-116962 A, the sliding of the plated layer is stopped by the dummy wiring, so the plated layer is prevented from becoming electrically connected to the gate wiring layer. However, the inventors discovered through intense study that with this kind of semiconductor device, not only the plated layer, but also the electrode that is joined to the plated layer, may slide due to a change in temperature. Therefore, in the technology described in JP 2005-116962 A, there is a possibility that, although a short between the emitter electrode and the gate wiring electrode due to the plating layer sliding is able to be prevented, sliding of the emitter electrode is unable to be inhibited. If the electrode slides, the reliability of the semiconductor device may be diminished.

SUMMARY OF THE INVENTION

The invention thus provides technology that inhibits the electrode itself from sliding.

One aspect of the invention relates to a semiconductor device that includes a semiconductor substrate and a first electrode. An element region is formed on the semiconductor substrate. The first electrode is arranged on the semiconductor substrate and is electrically connected to the element region formed on the semiconductor substrate. The first electrode is made of at least two materials with different moduli of elasticity. A modulus of elasticity per unit area of an outer peripheral portion of the first electrode when the semiconductor substrate is viewed from above is smaller than a modulus of elasticity per unit area of a center portion of the first electrode. The electrode in this specification does not have to have conductivity in all regions, i.e., it may have conductivity in only one or some regions. Even if the electrode includes a region that does not have conductivity at a portion, when this region is surrounded by regions having conductivity and the function of this region as a whole electrode is not impeded, the whole that includes this region will be regarded as an electrode. Therefore, a portion of the electrode may be made of insulating material.

In the semiconductor device described above, when the semiconductor substrate is viewed from above, the modulus of elasticity of the outer peripheral portion of the first electrode is smaller than the modulus of elasticity of the center portion of the first electrode. That is, the outer peripheral portion of the first electrode deforms more easily with respect to stress than the center portion of the first electrode does. Therefore, even if thermal stress is generated in the first electrode due to a difference in the thermal expansion rates of the first electrode and the semiconductor substrate, this thermal stress is able to be mitigated at the outer peripheral portion of the first electrode. Therefore, the first electrode is able to be inhibited from sliding due to thermal expansion.

The semiconductor device according to the aspect of the invention may also include a second electrode. The second electrode is arranged on a surface of the semiconductor substrate that is on a side opposite a surface of the semiconductor substrate on which the first electrode is arranged. Also, the first electrode may be an emitter electrode, and the second electrode may be a collector electrode.

The details and further improvements of the invention will hereinafter be described in detail via example embodiments and modes for carrying out the invention.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 4 is a plan view of a semiconductor device according to a third example embodiment of the invention; and FIG. 5 is a plan view of a semiconductor device according to a modified example of the third example embodiment of the invention.

DETAILED DESCRIPTION OF EMBODIMENTS

Figure 1:
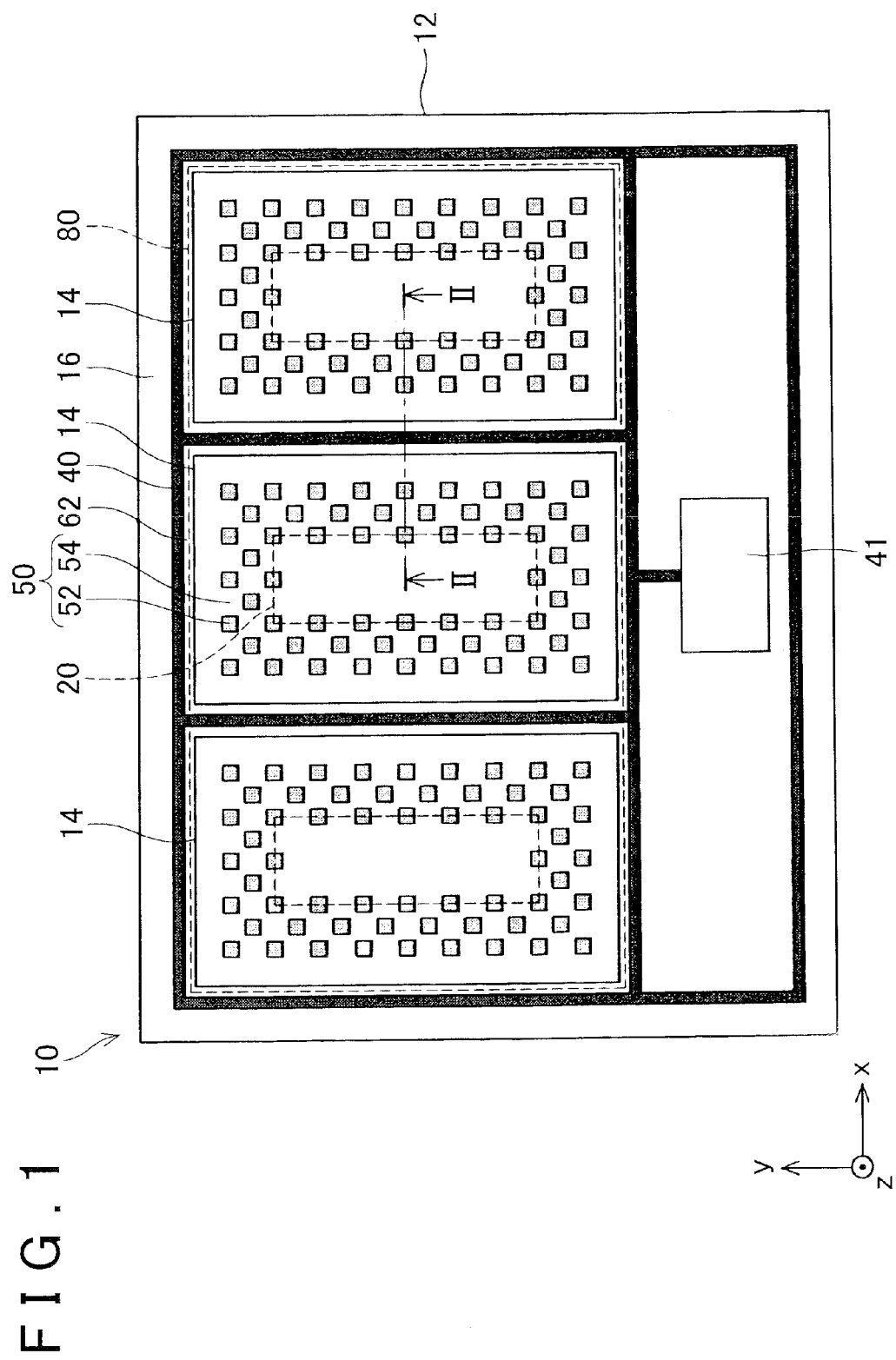
FIG. 1 is a plan view of a semiconductor device according to a first example embodiment of the invention.

Some of the structures of the example embodiments described below will be listed. The structures described below are all independent structures that display technical utility both alone and in various combinations, and are not limited to the combinations in the example embodiments.

The semiconductor device of the invention may have a plated layer and a metal block layer. The plated layer is arranged on an upper surface of a first electrode. Here, the upper surface of the first electrode refers to a surface of the first electrode that is on a side opposite a surface of the first electrode that is arranged on a semiconductor substrate. The metal block is arranged on an upper surface of the plated layer. Here, the upper surface of the plated layer refers to a surface of the plated layer that is on a side opposite a surface of the plated layer that is arranged on the first electrode. The metal block may cover at least a portion of the first electrode, and be electrically connected to the first electrode via the plated layer. According to this structure, the upper surface of the first electrode contacts the metal block via the plated layer, and a lower surface of the first electrode contacts the semiconductor substrate. Therefore, thermal stress is generated in the first electrode due to a difference in the thermal expansion rates of the metal block, the first electrode, and the semiconductor substrate. However, with this semiconductor device, an outer peripheral portion of the first electrode deforms more easily with respect to stress than the center portion of the first electrode does. Therefore, thermal stress generated in the first electrode is mitigated at the outer peripheral portion of the first electrode. According to this structure, the first electrode is able to be inhibited from sliding.

In the semiconductor device of the invention, a non-element region that surrounds an element region may also be formed on the semiconductor substrate. An insulated gate semiconductor element may also be formed in this element region. Also, a gate wiring layer that is electrically connected to an insulated gate of the semiconductor element may be formed on the non-element region. The outer peripheral portion of the first electrode may be nearer to the gate wiring layer than the center portion of the first electrode is. According to this structure, the gate wiring layer is arranged in a position closer to the outer peripheral portion than to the center portion of the first electrode. The outer periphery of the first electrode deforms more easily with respect to stress than the center portion of the first electrode does. That is, thermal stress generated in the first electrode is mitigated more at the outer peripheral portion than at the center portion of the first electrode. Therefore, the outer peripheral portion of the first electrode is able to be inhibited from sliding. According to this structure, the first electrode is inhibited from sliding, and is thus inhibited from becoming electrically connected to the gate wiring layer (i.e., a short is inhibited).

In the semiconductor device of the invention, a modulus of elasticity per unit area of the first electrode may become smaller from the center portion of the first electrode toward the gate wiring layer. According to this structure, the deformability of the first electrode with respect to stress gradually increases from the center portion toward the outer peripheral portion of the first electrode. According to this structure, thermal stress generated in the first electrode is increasingly mitigated from the center portion of the first electrode toward the outer peripheral portion of the first electrode. Therefore, the first electrode is able to be better inhibited from sliding.

In the semiconductor device of the invention, the first electrode may be arranged on a portion, of the element region of the semiconductor substrate via an insulating film. Also, the first electrode may have at least one insulator made of insulating material. Furthermore, the modulus of elasticity of the insulator may be smaller than the modulus of elasticity of material other than the insulating material of which the first electrode is formed, i.e., of a conductor. The insulator may also be arranged on the insulating film. According to this structure, the first electrode is arranged on a portion on the element region via the insulating film. At the portion where the insulating film is formed, there is no carrier movement between the semiconductor substrate and the first electrode. Therefore, a carrier accumulating region may be formed in an area in the element region, so the on-resistance of the semiconductor device is able to be lowered. Also, a portion of the first electrode is made of insulating material that has a low modulus of elasticity, so the modulus of elasticity of the first electrode is able to be easily adjusted. When a portion of the first electrode is simply an insulator, current will not flow at this portion, so the resistance of the first electrode is increased. However, with this semiconductor device, the insulator is arranged above the insulating film. The resistance of the first electrode is able to be inhibited from increasing by arranging the insulator at a location in the element region where current will not flow.

Figure 2:
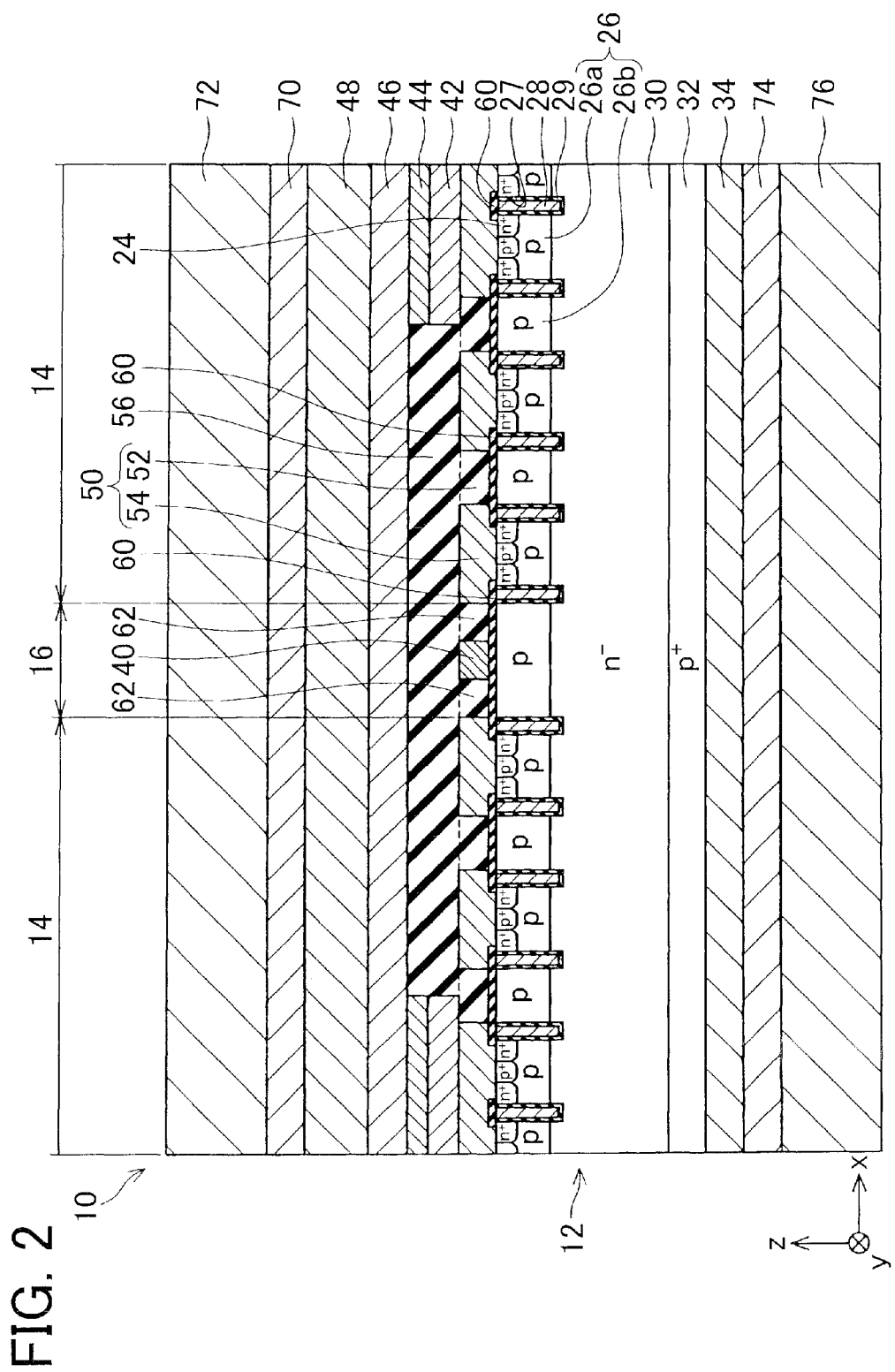
FIG. 2 is a longitudinal sectional view taken along line II-II of the semiconductor device according to the first example embodiment.

Now, a semiconductor device 10 according to a first example embodiment of the invention will be described. FIG. 1 is a plan view of the semiconductor device 10, and FIG. 2 is a longitudinal sectional view taken along line II-II of the semiconductor device 10 in FIG. 1. The semiconductor device 10 includes a semiconductor substrate 12, an electrode, an insulating film, a metal block 48, and heat sinks 72 and 76 and the like, as shown in FIG. 2. In FIG. 1, members above (i.e., in a z direction) a plated layer 42 shown in FIG. 2 are omitted in order to make the drawing easier to see.

As shown in FIG. 1, the semiconductor substrate 12 has an element region 14, and a non-element region 16 that surrounds the element region 14. The element region 14 is a rectangular region. Three of these element regions 14 are formed lined up in an x direction of the semiconductor substrate 12 (hereinafter, these element regions 14 and other regions and portions provided in plurality may also be referred to in the singular to facilitate understanding). The structures of these element regions 14 are substantially the same, with an Insulated Gate Bipolar Transistor (hereinafter simply referred to as "IGBT" that will be described later) formed in each element region 14. The non-element region 16 is formed in a region other than the element region 14 of the semiconductor substrate 12. A gate wiring layer 40 and a gate pad 41 are arranged in the non-element region 16. The gate pad 41 is arranged in generally the center in the x direction on the semiconductor substrate 12. The gate wiring layer 40 surrounds each of the element regions 14 and the gate pad 41. More specifically, the gate wiring layer 40 that surrounds the element regions 14 is arranged a certain distance away from the element regions 14, and includes a gate wiring layer that is substantially parallel to a longitudinal direction of the element region 14, and a gate wiring layer that is substantially parallel to a short direction of the element region 14. The gate wiring layer arranged between adjacent element regions 14 is arranged passing through generally the center between adjacent element regions 14. Meanwhile, a part of the gate wiring layer 40 that surrounds the gate pad 41 includes gate wiring layers that extend in a −y direction from the gate wiring layer arranged on both sides in the x direction of the element regions 14, and gate wiring layers that are substantially parallel to the short direction of the element regions 14. These gate wiring layers are connected together, and the gate wiring layer 40 is connected to the gate pad 41. The gate pad 41 is electrically connected to a gate electrode 28, which will be described later, by the gate wiring layer 40. One end of a wire (not shown) is bonded to the gate pad 41, and the other end of this wire is connected to an external circuit. A peripheral voltage-resistant region is formed in the non-element region 16. The peripheral voltage-resistant region is a conventionally well-known structure, so a description of thereof will be omitted.

As shown in FIG. 2, a collector electrode 34 is formed on an entire lower surface of the semiconductor substrate 12. In this example embodiment, the collector electrode 34 is made of aluminum.

An emitter electrode 50 is formed on an upper surface of the semiconductor substrate 12. The emitter electrode 50 is formed on an upper surface of each of the element regions 14. As shown in FIG. 1, dimensions in a xy plane of the emitter electrode 50 are substantially the same as the dimensions of the element regions 14. A number of generally square regions are formed on an upper surface of the emitter electrode 50. These regions are formed at equally-spaced intervals in the x direction and the y direction on an outer peripheral portion, but are not formed on a center portion, of the upper surface of the emitter electrode 50. Also, regions that are formed lined up in the x direction at the top (in the y direction) of FIG. 1 will be referred to as "first row regions". Also, when regions formed lined up in the x direction from the first row downward, i.e., in the −y direction, are referred to in order as "second row regions", and "third row regions", etc., the second row regions are formed in positions offset in the x direction from the first row regions. That is, the odd row regions are formed in substantially the same position in the x direction, and the even row regions are formed in positions between adjacent odd row regions. Also, a length of one side of each region is shorter than a distance between adjacent regions. Therefore, the regions will not overlap. These regions extend from the upper surface of the emitter electrode 50 to the lower surface of the emitter electrode 50 (i.e., in the z direction). That is, these regions have generally cuboid shapes.

An insulator 52 is arranged in the regions described above. A portion of the emitter electrode 50 other than these regions is formed of a conductor 54. That is, the emitter electrode 50 is formed of the conductor 54 and the insulator 52. The percentage of the emitter electrode 50 occupied by the insulator 52 is preferably no more than approximately 50%. Also, the insulator 52 is preferably arranged dispersed over a plurality of regions. In this example embodiment, the conductor 54 is made of AlSi, and the insulator 52 is made of polyimide. Young's modulus (i.e., the longitudinal modulus of elasticity) of AlSi and polyimide is approximately 77 [GPa] and approximately 5 [GPa], respectively. In other words, the emitter electrode 50 is made of two materials having different Young's modulus. Also, Young's modulus of the polyimide that forms the insulator 52 is significantly smaller than Young's modulus of the AlSi that forms the conductor 54. Therefore, the outer peripheral portion of the emitter electrode 50 where the insulator 52 is arranged has a smaller modulus of elasticity per unit area than the center portion where the insulator 52 is not formed does. Further, as shown in FIG. 1, the gate wiring layer 40 surrounds the emitter electrode 50. Therefore, the gate wiring layer 40 is closer to the outer peripheral portion of the emitter electrode 50 than it is to the center portion of the emitter electrode 50. Also, an insulator 62 is arranged between the emitter electrode 50 and the gate wiring layer 40. The emitter electrode 50 (i.e., the conductor 54 of the emitter electrode 50) is insulated from the gate wiring layer 40 by this insulator 62.

Next, the metal block 48 and the heat sinks 72 and 76 will be described. As shown in FIGS. 1 and 2, a plated layer is arranged in an area surrounded by a broken line 20 of the upper surface of the emitter electrode 50. The plated layer is a two-layer structure in which a plated layer 42 formed of Ni and a plated layer 44 formed of Au are arranged in order in the z direction. The plated layer 42 is electrically connected to the emitter electrode 50. The plated layer 42 is formed by an electroless plating process, for example. On the other hand, the plated layer 44 is arranged on the entire upper surface of the plated layer 42. The plated layer 44 is electrically connected to the plated layer 42. The plated layer 44 is formed by a wet electroless plating process, for example.

An insulating film 56 is formed in an area where the plated layers 42 and 44 are not formed, in the area surrounded by a broken line 80 in FIG. 1. As shown in FIG. 2, the insulating film 56 is formed to a position at the same height as the plated layer 44, on the upper surfaces of the emitter electrode 50, the gate wiring layer 40, and the insulator 62. The insulating film 56 may be formed integrally with the insulator 52 and the insulator 62, or may be formed of a separate body.

The metal block 48 is joined to the upper surfaces of the plated layer 44 and the insulating film 56 via solder 46. The metal block 48 has the dimensions indicated by the broken line 80 in FIG. 1, and is arranged covering the three element regions 14. That is, the metal block 48 is arranged so as to cover the entire upper surface of the emitter electrode 50. The metal block 48 is electrically connected to the emitter electrode 50 via the solder 46 and the plated layers 44 and 42. That is, the emitter electrodes 50 formed in the element regions 14 are also electrically connected together via the metal block 48. The metal block 48 transfers heat from an IGBT (that will be described later) to a heat sink 72 (that will also be described later). In this example embodiment, the metal block 48 is formed of Cu.

The heat sink 72 is joined to the upper surface of the metal block 48 via solder 70. Meanwhile, a heat sink 76 is joined to a lower surface of the collector electrode 34 via solder 74. That is, the heat sink 72 is electrically connected to the emitter electrode 50, and the heat sink 76 is electrically connected to the collector electrode 34. The heat sinks 72 and 76 release heat from the IGBT. In this example embodiment, the heat sinks 72 and 76 are formed of Cu.

Continuing on, the IGBT formed in the element region 14 will be described. A trench 27 is formed in the semiconductor substrate 12 in the element region 14. The inside surface of the trench 27 is covered by a gate insulating film 29. A gate electrode 28 is formed in the trench 27. An n-type emitter region 24, a p-type body region 26, an n-type drift region 30, and a p-type collector region 32 are formed in the semiconductor substrate 12 in the element region 14. The emitter region 24 is formed in an area exposed on the upper surface of the semiconductor substrate 12. The emitter region 24 is connected to the gate insulating film 29 that covers the gate electrode 28. The emitter region 24 is ohmically connected to the emitter electrode 50. The body region 26 is formed next to the emitter region 24 and below the emitter region 24. The body region 26 contacts the gate insulating film 29 below the emitter region 24. The body region 26 (the so-called body contact region) between two emitter regions 24 has a high p-type impurity concentration and is ohmically connected to the emitter electrode 50. In this example embodiment, the emitter region 24 and the body contact region are formed below where the conductor 54 of the emitter electrode 50 is arranged, but not below where the insulator 52 of the emitter electrode 50 is arranged. Hereinafter, the body region 26 where the emitter region 24 and the body contact region are formed in particular will be referred to as "body region 26a", and the body region 26 where the emitter region 24 and the contact region are not formed in particular will be referred to as "body region 26b". The drift region 30 is formed on the lower side of the body region 26. The drift region 30 is separated from the emitter region 24 by the body region 26. The drift region 30 contacts the gate insulating film 29 at a lower end portion of the trench 27. The collector region 32 is formed on the lower side of the drift region 30. The collector region 32 has a high p-type impurity concentration and is ohmically connected to the collector electrode 34. An IGBT is formed in the element region 14, by the electrodes and semiconductor regions described above.

An insulating film 60 is formed on the upper surface of the element region 14. A portion of the insulating film 60 above which the conductor 54 of the emitter electrode 50 is arranged is removed by etching. More specifically, etching is performed such that, of the insulating film 60 below the conductor 54, a portion of the insulating film 60 that covers the upper surface of the trench 27 remains. Therefore, the insulating film 60 above the body region 26a etched, but the insulating film 60 above the body region 26b is not etched. As a result, the conductor 54 ohmically contacts the emitter region 24 and the body contact region. The emitter electrode 50 (i.e., the conductor 54 of the emitter electrode 50) is insulated from the gate electrode 28 by this insulating film 60. With this structure, in other words, at the outer peripheral portion of the emitter electrode 50, the insulator 52 is able to be arranged above the area where the insulating film 60 is arranged.

The insulating film 60 is also formed on the upper surfaces of the non-element regions 16 that are between adjacent element regions 14.

When using the semiconductor device 10 described above, the collector electrode 34 is connected to a power supply potential, and the emitter electrode 50 is connected to a ground potential. When the potential applied to the gate pad 41 is less than a threshold value potential, the semiconductor device 10 is off. When the potential applied to the gate pad 41 is equal to or greater than the threshold value potential, the semiconductor device 10 is on. That is, in the element region 14, the potential applied to the gate pad 41 is applied to the gate electrode 28 via the gate wiring layer 40. When the potential applied to the gate electrode 28 is equal to or greater than the threshold value potential, a channel is formed in the body region 26 in an area contacting the gate insulating film 29. As a result, electrons flow from the emitter electrode 50 to the collector electrode 34, through the emitter region 24, the channel in the body region 26, the drift region 30, and the collector region 32. That is, current flows from the collector electrode 34 to the emitter electrode 50. At this time, the insulating film 60 is arranged above the body region 26b, so holes will not flow from the body region 26b to the emitter electrode 50. Therefore, holes accumulate in the drift region 30, so the on-resistance of the semiconductor device 10 is reduced. Thus, the body region 26b functions as a hole accumulating region.

When the semiconductor device 10 of the first example embodiment is on, current flows through the semiconductor device 10, and the semiconductor device 10 generates heat, so the temperature of various portions of the semiconductor device 10 increases. Conversely, when the semiconductor device 10 is off, the current that flows through the semiconductor device 10 is interrupted, so the heat generation of the semiconductor device 10 stops. As a result, the temperature of various portions of the semiconductor device 10 drops. When there is a temperature change in various portions of the semiconductor device 10 in this way, thermal stress repeatedly acts on the various portions of the semiconductor device 10 due to a difference in thermal expansion rates. In particular, the thermal expansion rate (approximately $21 \times 10^{-6}$ [/K]) of AlSi, which is the material of the conductor 54 that forms the emitter electrode 50, is significantly larger than the thermal expansion rate (approximately $4.5 \times 10^{-6}$ [/K]) of SiC, which is the material of the semiconductor substrate 12. Therefore, thermal stress caused by the difference in the thermal expansion rates of the two is generated in the conductor 54 due to the temperature change described above. With the emitter electrode 50 in this example embodiment, a number of the insulators 52 that are made of polyimide are arranged on the outer peripheral portion. As described above, Young's modulus of polyimide (approximately 5 [GPa]) is significantly smaller than Young's modulus of AlSi (approximately 77 [GPa]). Therefore, the outer peripheral portion of the emitter electrode 50 deforms extremely easily with respect to stress. Accordingly, the thermal stress generated in the emitter electrode 50 is mitigated by the insulator 52 that is arranged around the conductor 54 deforming. Hence, the emitter electrode 50 is inhibited from sliding due to the conductor 54 repeatedly thermally expanding and thermally contracting.

Moreover, in this example embodiment, the metal block 48 is joined to the upper surface of the emitter electrode 50 via the plated layers 42 and 44, and the solder 46. The heat sink 72 is joined to the upper surface of the metal block 48 via the solder 70. The thermal expansion rate of Cu from which the metal block 48 and the heat sink 72 are formed is approximately $17 \times 10^{-6}$ [/K]. When the semiconductor device 10 is on, the IGBT generates heat and temperature of the entire semiconductor device 10 becomes high. Conversely, when the semiconductor device 10 is off, the temperature of semiconductor device 10 drops to the outside temperature. Thermal stress is generated in the emitter electrode 50 by the metal block 48, the heat sink 72, and the semiconductor substrate 12 repeatedly thermally expanding and thermally contracting due to different thermal expansion rates as the temperature changes in this way. The insulating bodies 52 are arranged at equally spaced intervals on the emitter electrode 50 of the example embodiment, so the thermal stress of the emitter electrode 50 is mitigated by these insulating bodies 52. As a result, sliding of the outermost periphery of the emitter electrode 50 is inhibited. Thus, according to this structure, electrical connection (i.e., a short) between the emitter electrode 50 and the gate wiring layer 40 due to the emitter electrode 50 sliding is inhibited. Because it is no longer necessary to form a dummy wiring layer or the like between the emitter electrode 50 and the gate wiring layer 40, the distance between the emitter electrode 50 and the gate wiring layer 40 can be shortened, so the semiconductor substrate 12 can be used effectively.

Also, the body region 26b functions as a hole accumulating region. In this example embodiment, the region where the insulating film 60 is formed is below the insulator 52. Therefore, even if the insulating film 60 were formed, current would not flow to the emitter electrode 50 (i.e., the insulator 52 of the emitter electrode 50). That is, in this example embodiment, a region where current originally does not flow is used as the hole accumulating region. Therefore, the on-voltage of the semiconductor device 10 is able to be reduced without increasing the conduction resistance of the semiconductor device 10.

Figure 3:
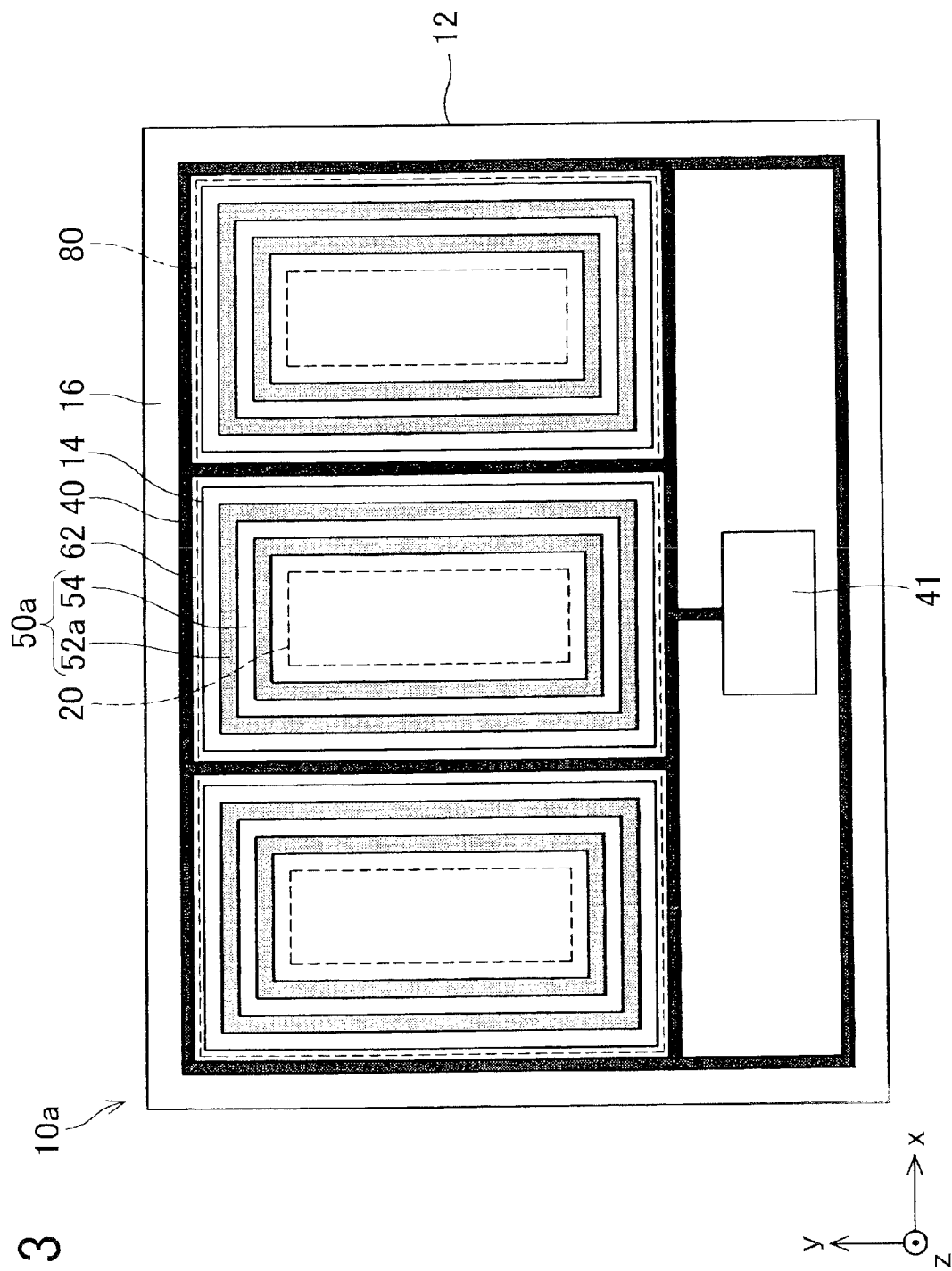
FIG. 3 is a plan view of a semiconductor device according to a second example embodiment of the invention.

Next, a second example embodiment of the invention will be described with reference to FIG. 3. Hereinafter, only those points that differ from the first example embodiment will be described. Detailed descriptions of structure similar to that of the first example embodiment will be omitted.

In a semiconductor device 10a according to the second example embodiment, a loop region is formed on an upper surface of an emitter electrode 50a. This loop region is formed in two loops surrounding a contact surface between the emitter electrode 50a and the plated layer 42. The inner loop region is formed a fixed distance away from the contact surface, and the outer loop region is formed a fixed distance away from the inner loop region. These regions extend from an upper surface of the emitter electrode 50a to a lower surface of the emitter electrode 50a. A conductor 52a (Al in this example embodiment) is arranged in each of these regions. That is, in this example embodiment, the emitter electrode 50a is formed of a conductor. Also, although not shown, the insulating film 60 is formed covering only the upper surface of the trench 27, and the emitter region 24 and the body contact region are also formed in the body region 26b. That is, in this example embodiment, the hole accumulating region is not formed.

Young's modulus of Al is approximately 70 [GPa], which is smaller than Young's modulus of AlSi (approximately 77 [GPa]) of which the conductor 54 is formed. Therefore, the outer peripheral portion of the emitter electrode 50a bends easier with respect to stress than the center portion of the emitter electrode 50a does. Hence, the semiconductor device 10a also displays similar effects to the semiconductor device 10 of the first example embodiment in terms of mitigating thermal stress generated in the emitter electrode 50a. Also, the conductor 52a is formed in two loops, so the deformation amount of the emitter electrode 50a becomes less toward the outside from the center portion of the emitter electrode 50a, so sliding of the outermost periphery of the emitter electrode 50a is able to be inhibited. Furthermore, because the emitter electrode 50a is formed of a conductor, the resistance of the emitter electrode 50a is able to be inhibited from increasing compared with when a portion of the emitter electrode 50a is formed of an insulator.

Next, a third example embodiment of the invention will be described with reference to FIG. 4. Hereinafter, only those points that differ from the first example embodiment will be described. Detailed descriptions of structure similar to that of the first example embodiment will be omitted.

A semiconductor device 10b according to the third example embodiment differs from the semiconductor device 10 according to the first example embodiment in the following respects. That is, regions where insulators 52b are arranged have generally round shapes, with the dimensions gradually becoming larger from the center of an emitter electrode 50b outward. According to this structure, the modulus of elasticity per unit area of the emitter electrode 50b becomes smaller from a center portion of the emitter electrode 50b toward the gate wiring layer 40. That is, the deformability of the emitter electrode 50b with respect to stress gradually increases from the center portion toward the outside. According to this structure as well, thermal stress generated in the emitter electrode 50b is mitigated by the insulators 52b, so the emitter electrode 50b is able to be inhibited from sliding at the outermost periphery of the emitter electrode 50b. Typically, when a region where stress is mitigated (i.e., the insulator 52b in this example embodiment) deforms, it may affect the semiconductor element formed below that region. According to the structure of this example embodiment, the amount of deformation of the insulator 52b is controlled by changing the dimensions of the regions where the insulators 52b are arranged, according to the position on the emitter electrode 50b. More specifically, the insulator 52b with large dimensions is arranged in a region where the semiconductor elements are relatively sparse. Therefore, even if the insulator 52b largely deforms, the effect on the semiconductor element below the insulator 52b will be reduced.

Next, a modified example of the third example embodiment of the invention will be described with reference to FIG. 5. Hereinafter, only those points that differ from the third example embodiment will be described. Detailed descriptions of structure similar to that of the third example embodiment will be omitted.

A semiconductor device 10c according to the modified example differs from the semiconductor device 10b according to the third example embodiment in the following respects. That is, the dimensions of regions where insulators 52c are arranged are substantially the same regardless of the positions of the insulator 52c on the emitter electrode 50c. Also, the distance in the circumferential direction between adjacent insulators 52c becomes narrower from a center portion of the emitter electrode 50c outward. In other words, the insulators 52c are densely arranged from the center portion of the emitter electrode 50c toward the outside. According to this structure as well, the deformability of the emitter electrode 50c with respect to stress gradually increases from the center portion toward the outside. Therefore, the semiconductor device 10c according to the modified example displays similar effects to those displayed by the semiconductor device 10b according to the third example embodiment.

Heretofore, example embodiments and modified examples of the invention are described in detail, but the invention is not limited to these example embodiments. That is, the invention also includes various modifications of the example embodiments described above.

For example, in the example embodiments described above, the conductor 54, the insulator 52, and the conductor 52a are made of AlSi, polyimide, and Al, respectively, but the invention is not limited to this. As long as Young's modulus of the insulator 52 and the conductor 52a is smaller than the Young's modulus of the conductor 54, the conductor 54, the insulator 52, and the conductor 52a may also be made of other materials. Also, the regions that mitigate stress (i.e., the insulator 52, the conductor 52a, and the like) are arranged surrounding the joining surface of the emitter electrode 50 and the plated layer 42, but these regions that mitigate stress above may not be formed in regions that are unaffected even if the emitter electrode 50 slides (e.g., regions where the gate wiring layer 40 is not arranged).

Also, in the first example embodiment, a conductor may also be formed in the regions where the insulators 52 are arranged. Young's modulus of the conductor is preferably smaller than Young's modulus of the conductor 54. In this case, a hole accumulating region may not be formed (i.e., the insulating film 60 may be formed covering only the upper surface of each trench 27). The emitter region 24 and the body contact region may also be formed in the body region 26b. Also, the shapes of the regions where the insulators 52 are formed are not limited to being generally square shapes, i.e., they may also be rectangular, circular, or oval. This is also the same for the third example embodiment and the modified example of the third example embodiment as well. Also, in the first example embodiment, the emitter region 24 and the body contact region are not formed in the hole accumulating region (i.e., the body region 26b), but these regions may also be formed in the hole accumulating region (i.e., the body region 26b).

Moreover, in the example embodiments described above, the plated layers 42 and 44 may be arranged so as to cover the entire upper surface of the three emitter electrodes. At this time, the gate wiring layer 40 and the emitter electrode 50 adjacent to the gate wiring layer 40 are of course insulated. Also, in the example embodiments, a so-called both-face cooling type semiconductor device in which the heat sinks 72 and 76 are respectively joined to both surfaces of the semiconductor substrate 12 is described, but the semiconductor device is not limited to being a both-face cooling type semiconductor device as long as it is a semiconductor device in which stress is generated in an electrode. Also, the emitter electrodes 50 are electrically connected by the metal block 48, but the emitter electrode 50 may also be electrically connected by forming an emitter pad on the semiconductor substrate 12. Also, a region that mitigates stress may also be formed on a semiconductor device in which a dummy wiring layer is arranged. Further, a number of element regions 14 may be formed on the semiconductor substrate 12. A signal speed is able to be increased by making the dimensions of the element region 14 smaller. Also, the element structure formed in the element region 14 is not limited to being an IGBT, i.e., it may also be a switching element (trench-type or planar-type) such as a MOS. Also, the conductivity type in the example embodiments described above is not limited to that described. That is, the IGBT may also be a pnp-type IGBT. Further, the region that mitigates stress may be formed only in one loop or a plurality of loops around the joining surface of the emitter electrode 50 and the plated layer 42, as long the emitter electrode 50 is able to be inhibited from sliding. Moreover, in the IGBT, a buffer layer with a higher impurity concentration than the drift layer may also be formed in the drift layer. The buffer layer is a region that contacts an upper surface of the contact region.

Heretofore, specific examples of the invention have been described in detail, but these are merely examples, and are not intended to limit the invention. The invention also includes various modifications of the specific examples described above. Also, the technical elements illustrated in the specification and the drawings display technical utility both alone and in various combinations. Further, the technology illustrated in the specification and the drawings simultaneously achieves a plurality of objects. Therefore, the technology illustrated in the specification and the drawings has technical utility by simply achieving one of these objects.

What is claimed is:

1. A semiconductor device comprising:
a semiconductor substrate on which an element region is formed; and
a first electrode that is arranged on the semiconductor substrate and is electrically connected to the element region formed on the semiconductor substrate, wherein
the first electrode is made of at least two materials with different moduli of elasticity, and
a modulus of elasticity per unit area of an outer peripheral portion of the first electrode when the semiconductor substrate is viewed from above is smaller than a modulus of elasticity per unit area of a center portion of the first electrode.

2. The semiconductor device according to claim 1, further comprising:
a plated layer that is arranged on a first surface of the first electrode, the first surface of the first electrode being on a side opposite a second surface of the first electrode, the second surface of the plated layer being arranged on the semiconductor substrate; and
a metal block that is arranged on a first surface of the plated layer, the first surface of the plated layer being on a side opposite a second surface of the plated layer, the second surface of the plated layer being arranged on the first electrode, wherein
the metal block covers at least a portion of the first electrode and is electrically connected to the first electrode via the plated layer.

3. The semiconductor device according to claim 1, wherein
a non-element region that surrounds the element region is formed on the semiconductor substrate;
an insulated gate semiconductor element is formed in the element region;
a gate wiring layer that is electrically connected to an insulated gate of the semiconductor element is arranged on the non-element region; and
the outer peripheral portion of the first electrode is nearer to the gate wiring layer than the center portion of the first electrode is.

4. The semiconductor device according to claim 3, wherein
a modulus of elasticity per unit area of the first electrode becomes smaller from the center portion of the first electrode toward the gate wiring layer.

5. The semiconductor device according to claim 1, wherein
the first electrode is arranged on a portion, in the element region, of the semiconductor substrate via an insulating film,
the first electrode includes at least one insulator made of insulating material,
a modulus of elasticity of the insulator is smaller than a modulus of elasticity of a conductor that forms the first electrode, and
the insulator is arranged on the insulating film.

6. The semiconductor device according to claim 5, further comprising:
a second electrode that is arranged on a second surface of the semiconductor substrate, the second surface of the semiconductor substrate being on a side opposite a first surface of the semiconductor substrate on which the first electrode is arranged, wherein
the first electrode is an emitter electrode;
the second electrode is a collector electrode;
an emitter region, a body region, a drift region, and a collector region are formed in order from a side near the emitter electrode, in the semiconductor substrate in the element region; and
the emitter region has a region that directly contacts the emitter electrode, and a region that directly contacts the insulating film.

7. The semiconductor device according to claim 1, further comprising:
a second electrode that is arranged on a second surface of the semiconductor substrate that is on a side opposite a first surface of the semiconductor substrate on which the first electrode is arranged, wherein
the first electrode is an emitter electrode; and
the second electrode is a collector electrode.

8. The semiconductor device according to claim 1, wherein
the first electrode is made of a conductor and an insulator that has a smaller modulus of elasticity than a modulus of elasticity of the conductor;
the outer peripheral portion of the first electrode is a region that includes the conductor and the insulator; and
the center portion of the first electrode is a region that includes the conductor, and does not include the insulator.

9. The semiconductor device according to claim 2, wherein
the metal block is joined to the first surface of the plated layer via solder.

10. The semiconductor device according to claim 5, wherein
the first electrode includes a plurality of the insulators, and
the insulators discontinuously surround the center portion of the first electrode in a circumferential direction of the center portion of the first electrode.

11. The semiconductor device according to claim 5, wherein
the insulator continuously surrounds the center portion of the first electrode in a circumferential direction of the center portion of the first electrode.

* * * * *